(12) United States Patent
Xu

(10) Patent No.: US 10,637,002 B2
(45) Date of Patent: Apr. 28, 2020

(54) ORGANIC LIGHT EMITTING DIODE DISPLAY PANEL, MANUFACTURING METHOD THEREOF, AND ORGANIC LIGHT EMITTING DIODE DISPLAY APPARATUS

(71) Applicant: Wuhan China Star Optoelectronics Semiconductor Display Technology Co., Ltd., Wuhan, Hubei (CN)

(72) Inventor: Bin Xu, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/133,905

(22) Filed: Sep. 18, 2018

(65) Prior Publication Data
US 2019/0355929 A1   Nov. 21, 2019

Related U.S. Application Data

(63) Continuation of application No. PCT/CN2018/096924, filed on Jul. 25, 2018.

(30) Foreign Application Priority Data

May 17, 2018   (CN) .......................... 2018 1 0475342

(51) Int. Cl.
*H01L 51/52* (2006.01)
*H01L 27/32* (2006.01)
*G06F 3/041* (2006.01)

(52) U.S. Cl.
CPC ........ *H01L 51/5253* (2013.01); *H01L 27/323* (2013.01); *G06F 3/0412* (2013.01); *G06F 2203/04103* (2013.01)

(58) Field of Classification Search
USPC .......................................................... 257/40
See application file for complete search history.

(56) References Cited

U.S. PATENT DOCUMENTS

| 2015/0194625 | A1 | 7/2015 | Kim |
| 2017/0262109 | A1 | 9/2017 | Choi et al. |
| 2018/0061899 | A1* | 3/2018 | Oh ........................ G06F 3/0412 |
| 2018/0226454 | A1 | 8/2018 | Liu et al. |
| 2019/0074460 | A1 | 3/2019 | Cai et al. |

FOREIGN PATENT DOCUMENTS

| CN | 108682751 A | 10/2018 |
| KR | 1020180012942 A | 2/2018 |

\* cited by examiner

*Primary Examiner* — Fazli Erdem

(57) ABSTRACT

The present disclosure discloses an organic light emitting diode display panel, a manufacturing method thereof, and an organic light emitting diode display apparatus. The organic light emitting diode display panel may include a display region and a non-display region, and a surface of the non-display region filled with a sealant layer to smooth the surface of the non-display region. The non-display region of the display panel of the present disclosure may have a smooth surface. A peripheral wiring may be facilitated, and a process difficulty of the wiring may be reduced. Moreover, the sealant layer may absorb and disperse the stress between the layers, and may improve a de-lamination condition caused by an excessive stress.

19 Claims, 2 Drawing Sheets

ORGANIC LIGHT EMITTING DIODE DISPLAY PANEL, MANUFACTURING METHOD THEREOF, AND ORGANIC LIGHT EMITTING DIODE DISPLAY APPARATUS

CROSS-REFERENCE TO RELATED APPLICATIONS

The present application is a continuation-application of International (PCT) Patent Application No. PCT/CN2018/096924, filed on Jul. 25, 2018, which claims foreign priority of Chinese Patent Application No. 201810475342.7, filed on May 17, 2018 in the State Intellectual Property Office of China, the entire contents of which are hereby incorporated by reference.

TECHNICAL FIELD

The described embodiments relate to a technology of display panel, and more particular to an organic light emitting diode display panel, a manufacturing method thereof, and an organic light emitting diode display apparatus.

BACKGROUND

An organic light emitting diode (OLED) has many excellent characteristics such as self-lamination, a low power consumption, a wide viewing angle, and a fast response, etc., and a panel made of OLED components has the characteristics of a simple structure, and bendability, etc., which has aroused extremely great interests in research and business communities, and is considered to be a next-generation display technology with a tremendous potential. A transparent display is also a major developing direction of display technology due to its application prospects in the field of 3D display and vehicle display.

Since the organic layer and the cathode of the OLED device are very sensitive to water and oxygen, various methods are needed to encapsulate the OLED device when preparing the OLED display panel. Currently, a thin film encapsulation (TFE) technology has been successfully applied to OLED display panels. In the display region of the OLED display panel, TFE may ensure better characteristics, and an entire surface may be made very smooth, but at the periphery portion, there is a large unevenness. As shown in FIG. 1, FIG. 1 is a schematic diagram of an embodiment of an OLED display panel in the related art. The OLED display panel shown in FIG. 1 has a large unevenness in its non-display region 11. Since the non-display region 11 of the display panel has unevenness, it may be affect peripheral wirings, such as a touch routing; at the same time, during subsequent processing (such as when the robot arm is transported), the glass periphery of the display panel may have a large stress, and the film layer of the periphery is prone to fall into de-lamination conditions.

SUMMARY

The technical problem to be solved by the present disclosure is to provide an organic light emitting diode display panel, a manufacturing method thereof, and an organic light emitting diode display apparatus. A surface of the non-display region of the display panel may be smooth. A peripheral wiring may be facilitated, and a process difficulty of the wiring may be reduced. Moreover, the sealant layer may absorb and disperse the stress between the layers, and may improve a de-lamination condition caused by an excessive stress.

In order to solve the above technical problem, a technical solution adopted by the present disclosure may be to provide an organic light emitting diode display panel; the organic light emitting diode display panel including a display region and a non-display region; and a surface of the non-display region being filled with a sealant layer, to smooth the surface of the non-display region.

In order to solve the above technical problem, a technical solution adopted by the present disclosure may be to provide an organic light emitting diode display apparatus, wherein the OLED display apparatus includes an OLED display panel, and the OLED display panel includes a display region and a non-display region; and a surface of the display region is filled with a sealant layer to smooth the surface of the non-display region.

In order to solve the above technical problem, a technical solution adopted by the present disclosure is to provide a manufacturing method of an organic light emitting diode display panel, the manufacturing method including: preparing a substrate; forming a display region and a non-display region of the display panel on the substrate; and filling a surface of the non-display region with a sealant layer to smooth the surface of the non-display region.

The beneficial effects of the present disclosure are that different from the prior art, the OLED display panel of the present disclosure may include a display region and a non-display region. The surface of the non-display region may be filled with a sealant layer to smooth the surface of the non-display region. A peripheral wiring may be facilitated, and a process difficulty of wiring may be reduced. Moreover, the sealant layer may absorb and disperse the stress between the layers, and may improve a de-lamination condition caused by an excessive stress.

DETAILED DESCRIPTION

The present disclosure provides an OLED display panel, a manufacturing method thereof, and an OLED display apparatus. To make the objective, technical solution, and technical effects of the present disclosure clear and definite, the present disclosure will be further described in details in the following description. It should be understood that the specific embodiments illustrated herein are merely intended to explain the present disclosure and not intended to limit the disclosure.

The present disclosure provides an OLED display panel, the OLED display panel may include a display region and a non-display region. A surface of the non-display region may be filled with a sealant layer to smooth the surface of the non-display region, and the display panel having such the structure may be convenient for a peripheral wiring. The process is simplified, and the sealant layer may absorb and disperse the stress between the layers, thereby a de-lamination condition caused by an excessive stresses may be improved.

Figure 1:
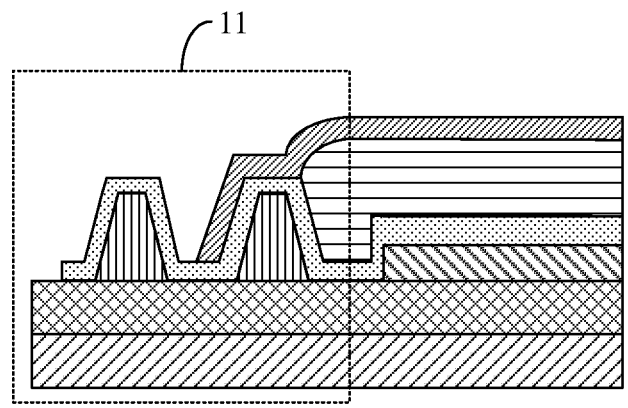
FIG. 1 is a schematic diagram of an embodiment of an OLED display panel in a related art.
Figure 2:
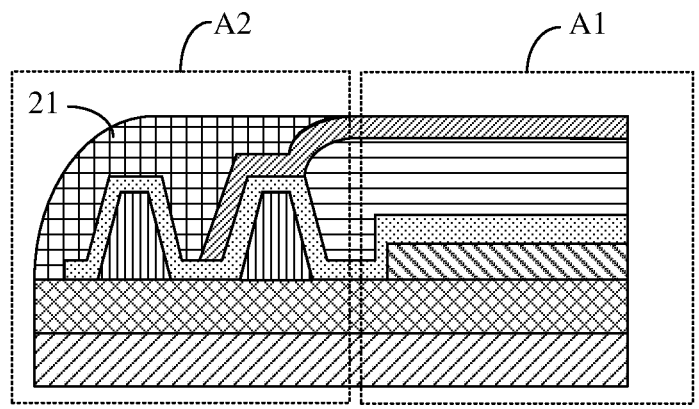
FIG. 2 is a schematic diagram of an embodiment of an OLED display panel of the present disclosure.

Referring to FIG. 2, FIG. 2 is a schematic structural diagram of an embodiment of an OLED display panel of the present disclosure. In an embodiment, the OLED display panel may include a display region A1 and a non-display region A2, and the surface of the non-display region A2 may be filled with a sealant layer 21 to smooth the surface of the non-display region A2. In an embodiment, the sealant layer 21 may be formed by a coating process.

In an embodiment, the sealant layer 21 may fill in the unevenness of the display panel in the related art, so as to facilitate the peripheral wiring, and improve the de-lamination of the film layer. In an actual manufacturing process, the display panel may need to be manufactured through multiple processes. Generally, it needs to be transported by a robot arm, and it may generate large stress on a periphery of the display panel. The sealant layer 21 may also serve as a protection layer, it may provide protection and disperse the stress on the portion where the sealant layer 21 is located with clamping or adsorbing by the robot arm. Thereby a de-lamination condition caused by an excessive periphery stress may be alleviated.

Herein, it should be noted that the unevenness mainly exists in the periphery region of the non-display region A2.

In an embodiment, the sealant layer 21 may be made of organic material, the organic material including any one of ultraviolet (UV) glue and frame glue, and other organic materials. Since the organic material may well disperse the stress between the layers, the problem of a de-lamination condition caused by an excessive stress applied to the periphery of the display panel may be solved.

Figure 3:
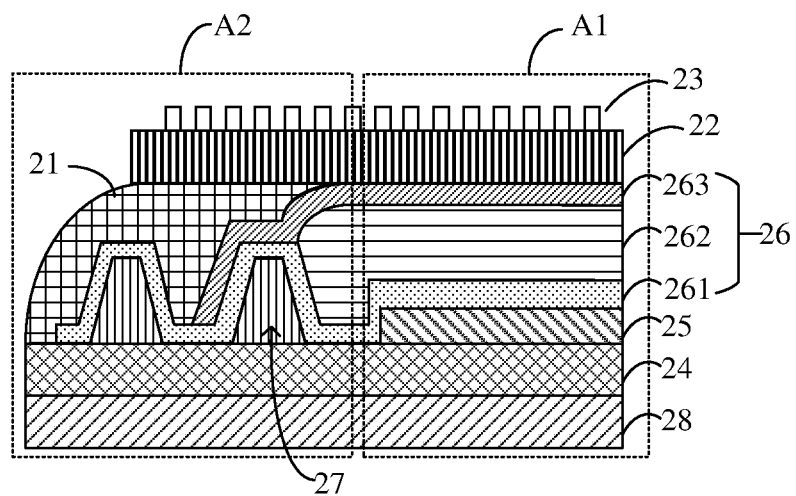
FIG. 3 is a schematic diagram of a specific embodiment of the OLED display panel of FIG. 2.

Further, referring to FIG. 3, FIG. 3 is a schematic diagram of a specific embodiment of the OLED display panel of FIG. 2.

In the embodiment, the display panel may further include an inorganic flat layer 22. Specifically, a surface of the display region A1 and at least part of the surface of the sealant layer 21 may be formed with the inorganic flat layer 22. A touch electrode layer 23 may be further provided on the inorganic flat layer 22, and the touch electrode layer 23 may be configured to implement a touch function of the display panel. Generally, not only the display region A1 has the touch electrode layer 23, but also the touch electrode layer 23 may extend to the non-display region A2. For example, an encapsulate pin of the touch electrode layer 23 may be disposed in the non-display region A2. When the surface of the non-display region A2 is not smooth enough, it may adversely affect the peripheral wiring corresponding to the touch electrode layer 23. The display panel of an embodiment may solve the above-mentioned problem, by a way that the sealant layer 21 may fill in the unevenness of the periphery portion of the non-display region A2. Therefore, the surface of the non-display region A2 may be smooth to facilitate peripheral wiring, and further to reduce the process difficulty of wiring. In an embodiment, the inorganic flat layer 22 may be relatively flat, and the wiring may be arbitrarily performed around its periphery. Optionally, a composition of the inorganic flat layer 22 may include at least one of silicon nitride, silicon dioxide, silicon oxynitride, aluminum oxide, or titanium oxide.

A structure of the display panel of the present embodiment may be specifically described below with reference to FIG. 3.

In embodiment, the non-display region A2 may include a device layer 24 and at least one retaining wall 27 disposed on the device layer 24, and a sealant layer 21 disposed on the retaining wall 27. In an embodiment, the non-display region A2 may include a device layer 24 and at least one retaining wall 27 disposed on the device layer 24, and a sealant layer 21 covering the retaining wall 27 and the device layer 27 which is not covered by the retaining wall 27. A recessed region of the non-display region A2 relative to the display region A1 may be filled by the sealant layer 21, so that a contact surface between the non-display region A2 and the display region A1 may be smooth.

Further, the non-display region A2 may further include an encapsulation layer 26, the encapsulation layer 26 may extend from the display region A1 to the non-display region A2. The encapsulation layer 26 may cover the retaining wall 27 and a portion of the device layer 24.

Herein, a relative height difference between the portion of encapsulation layer 26 located in the display region A1 and the device layer 24 may be substantially uniform, that is, the portion of encapsulation layer 26 may be relatively flat, but a relative height difference between the portion of the encapsulation layer 26 located in the non-display region A2 and the relative device layer may be is unequal, that is, an uneven region may be formed.

The sealant layer 21 may cover at least a portion of the encapsulation layer 26 and the device layer 24 not covered by the encapsulation layer 26, and the sealant layer 21 may be smoothly connected with the encapsulation layer 26 located in the display region A1, thus a smooth contact surface between the sealant layer 21 and the surface of the uncovered encapsulation layer 26 may be formed.

In addition, the display region A1 may include a device layer 24, an organic light-emitting layer 25 disposed on the device layer 24, and an encapsulation layer 26 covering the organic light-emitting layer 25. The sealant layer 21 may cover at least a portion of the encapsulation layer 26, to form the smooth contact surface with the surface of the uncovered encapsulation layer 26.

It should be noted that a boundary between the display region A1 and the non-display region A2 in the present disclosure may be determined by referring to a position of the organic light-emitting layer 25. The organic light-emitting layer 25 may be only located in the display region A1. Film layers such as the device layer 24, the encapsulation layer 26, and the like, may be distributed both in the display region A1 and in the non-display region A2.

Herein, the device layer 24 may be an array layer and is provided with a number of thin film transistors. The organic light-emitting layer 25 may include an anode, an organic layer, and a cathode. The organic layer may include a hole injection layer, a hole transport layer, a light-emitting layer, an electron transport layer, and an electron injection layer. In an embodiment, the anode may be an indium tin oxide (ITO)/Ag/ITO three-layer structure with a high work function and a high reflectivity, and the cathode may be an Mg/Ag metal alloy with a low work function.

Since the organic layer and the cathode of the organic light-emitting layer 25 are very sensitive to water and oxygen, the organic light-emitting layer 25 needs to be encapsulated by various means in the preparation of the OLED display panel. In an embodiment, the encapsulation layer 26 may be formed through the film packaging technology, by alternately depositing polymer organic film and inorganic film to form an encapsulation layer 26. The inorganic film may have good water and oxygen resisting properties, and the polymer film may well absorb and disperse the stress between the layers, to avoid reducing the resistance to water and oxygen due to a dense inorganic film breakage.

The encapsulation layer 26 may include a second inorganic layer 263, a first inorganic layer 261, and an organic layer 262 disposed between the second inorganic layer 263 and the first inorganic layer 261. The first inorganic layer 261 may be formed on the device layer 25, and the first inorganic layer 261 may cover the retaining wall 27.

Optionally, a composition of the second inorganic layer 263 may include at least one of silicon nitride, silicon dioxide, silicon oxynitride, aluminum oxide, or titanium oxide. A composition of the first inorganic layer 261 may include at least one of silicon nitride, silicon dioxide, silicon oxynitride, aluminum oxide, or titanium oxide. The composition of the organic layer 262 may include at least one of acrylic, epoxy resin, or silicon oxide.

In addition, in an embodiment, a number of the retaining walls 27 included in the display panel is not limited, and may be one or more. For example, including two retaining walls 27 disposed on the device layer 24, and the retaining wall 27 is located in the non-display region A2. In an embodiments, the retaining wall 27 may have a trapezoidal cross section. The first inorganic layer 261 of the encapsulation layer 26 may cover the retaining wall 27 and the organic light-emitting layer 25.

In an embodiment, on one hand, the retaining wall 27 may be configured to accommodate the organic layer 262 in a corresponding region to prevent a material of the organic layer 262 from overflowing, and on the other hand, a film orientation for the first inorganic layer 261 and the second inorganic layer 263 may be provided, to determine a corresponding location of film layers, further to facilitate the deposition of the corresponding film layer.

As shown in FIG. 3, the first inorganic layer 261 may cover an entire organic light-emitting layer 25, the retaining wall 27, and a portion of the device layer 24. The second inorganic layer 263 may cover an entire organic layer 262 and at least a portion of the first inorganic layer 261. Herein, the second inorganic layer 263 on the surface of the display region A1 may be flat, but the unevenness may be formed in the retaining wall 27 and the encapsulation layer 26 at the periphery portion of the non-display region A2. In an embodiment, the sealant layer 21 may be applied on a region corresponding to the unevenness by coating, and the sealant layer 21 and the shape of the unevenness in the periphery portion of and the non-display region A2 may be mutually compensated, to form a smooth contact surface on the sealant layer 21 and the surface of the encapsulation layer 26, thereby the surface of the non-display region A2 may be smoothed. In an embodiment, the sealant layer 21 may be flush with the second inorganic layer 263 in the encapsulation layer 26, such that the non-display region A2 of the display panel may be flat. In another embodiment, the sealant layer 21 and the encapsulation layer 26 may be smoothly and transitionally connected, and the contact surface between the sealant layer 21 and the second inorganic layer 263 in the encapsulation layer 26 may have a small curvature formed and may be substantially flat.

In an embodiment, the display panel further may include a substrate 28, and the substrate 28 may be a flexible substrate to achieve flexible displaying of the display panel.

Different from the prior art, the OLED display panel of the present disclosure may include a display region and a non-display region. The surface of the non-display region may be filled with a sealant layer, to smooth the surface of the non-display region. A peripheral wiring may be facilitated, and a process difficulty of wiring may be reduced. Moreover, the sealant layer may absorb and disperse the stress between the layers, and may improve a de-lamination condition caused by an excessive stress.

The present disclosure also provides an OLED display apparatus, which may include an OLED display panel of any of the above-mentioned embodiments of the present disclosure. Details about the specific structure of the OLED display panel may refer to FIG. 2, FIG. 3 and related text descriptions, and are not described herein again.

The display apparatus may include a mobile phone, a computer, a television, an e-book, and other smart devices, and may also be a transparent billboard.

Different from the prior art, the OLED display panel of the present disclosure may include a display region and a non-display region. The surface of the non-display region may be filled with a sealant layer, to smooth the surface of the non-display region. A peripheral wiring may be facilitated, and a process difficulty of wiring may be reduced. Moreover, the sealant layer may absorb and disperse the stress between the layers, and may improve a de-lamination condition caused by an excessive stress.

Figure 4:
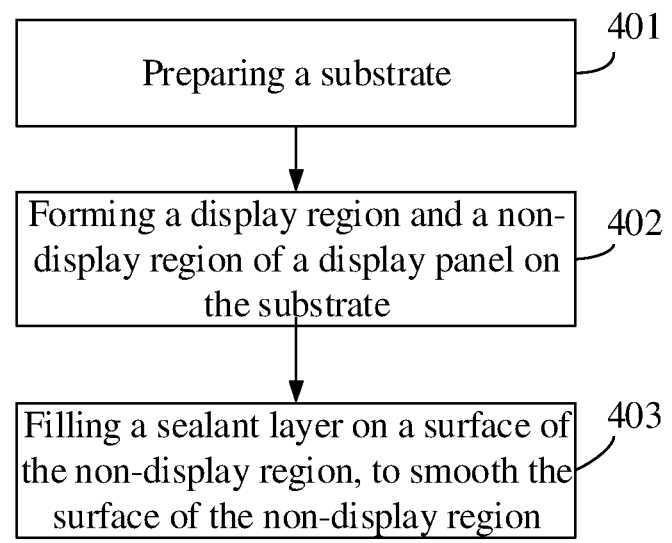
FIG. 4 is a flow chart of an embodiment of a manufacturing method of an OLED display panel of the present disclosure.

Referring to FIG. 4, FIG. 4 is a schematic flow chart of an embodiment of a manufacturing method of an OLED display panel of the present disclosure. The display panel of any of the above-mentioned embodiments may be manufactured by the manufacturing method.

In block 401, the method may include preparing a substrate.

In an embodiment, the substrate may be a glass substrate to provide support for subsequent film formation.

In block 402, the method may include forming a display region and a non-display region of the display panel on the substrate.

In an embodiment, a display region and a non-display region of the display panel may be formed on the substrate. Specifically, a device layer (array layer), an organic light-emitting layer, and an encapsulation layer may be sequentially formed on the substrate. The display region may include the device layer, the organic light emitting layer disposed on the device layer, and the encapsulation layer covering the organic light emitting layer. Herein, a portion of the device layer and a portion of the encapsulation layer may be located in the non-display region.

In an embodiment, the non-display region A2 may include the device layer and at least one retaining wall disposed on the device layer, and a sealant layer may be disposed on the retaining wall. In an embodiment, the non-display region A2 may include the device layer and at least one retaining wall disposed on the device layer. The sealant layer may cover the retaining wall and the device layer not covered by the retaining wall, and a recessed region of the non-display region A2 relative to the display region A1 may be filled by sealant layer, so that a contact surface between the non-display region A2 and the display region A1 may be smooth.

Further, the non-display region A2 may further include an encapsulation layer, the encapsulation layer may extend from the display region A1 to the non-display region A2. The encapsulation layer may cover the retaining wall and a portion of the device layer.

Herein, a relative height difference between the portion of encapsulation layer located in the display region A1 and the device layer may be substantially uniform, that is, the portion of encapsulation layer may be relatively flat, but a relative height difference between the portion of the encapsulation layer located in the non-display region A2 and the device layer may be unequal, that is, an uneven region may be formed.

The sealant layer may cover at least a portion of the encapsulation layer and the device layer not covered by the encapsulation layer, and the sealant layer may be smoothly connected with the encapsulation layer located in the display region A1, thus a smooth contact surface between the sealant layer and the surface of the uncovered encapsulation layer may be formed.

In an embodiment, the encapsulation layer may include a second inorganic layer, a first inorganic layer, and an organic layer between the second inorganic layer and the first inorganic layer. The first inorganic layer may be formed on the device layer.

A formation method of the encapsulation layer may be as following.

In block (1), after sequentially forming a device layer and an organic light-emitting layer on a substrate, the method further may include depositing a first inorganic layer on the device layer and the organic light-emitting layer by a plasma enhanced chemical vapor deposition (PECVD) apparatus. The first inorganic layer may be inorganic materials (for example, silicon nitride ($Si_3N_4$), silicon dioxide ($SiO_2$), silicon oxynitride (SiON), aluminum oxide ($Al_2O_3$), and titanium oxide ($TiO_2$), etc.).

In block (2), the method further may include printing an organic material (for example, acrylate, epoxy, siloxane) in the display region (a region corresponding to the organic light-emitting layer) through an inkjet printer device, to form an organic layer.

In block (3), the method further may include depositing a second inorganic layer by a PECVD device. The second inorganic layer may be an inorganic material (for example, silicon nitride ($Si_3N_4$), silicon dioxide ($SiO_2$), silicon oxynitride (SiON), aluminum oxide ($Al_2O_3$)), titanium oxide ($TiO_2$), etc.), and the second inorganic layer may cover an entire encapsulation film region (a display region and a portion of the non-display region) to achieve an encapsulation layer with high gas-resisting properties.

The organic layer formed in the block (2) may be configured to increase a flatness of the encapsulation layer in the display region of the OLED display panel, and a stress between the second inorganic layer and the first inorganic layer may be reduced.

In an embodiment, the device layer and the organic light-emitting layer may be sequentially formed on the substrate, and at least one retaining wall may be formed on the device layer (a portion of the organic light-emitting layer which is not covered), and specifically, the retaining wall may be made of organic photoresist material. In an embodiment, a cross section of the retaining wall may be trapezoidal. On one hand, the retaining wall may be configured to accommodate the organic layer in the corresponding region to prevent the material of the organic layer from overflowing, and on the other hand, a film orientation for the first inorganic layer and the second inorganic layer may be provided, to determine the corresponding location of the film layer, further to facilitate the deposition of the corresponding film layer. Then, the encapsulation layer may be formed by the above-mentioned blocks (1) to (3).

In an embodiment, the first inorganic layer may cover an entire organic light-emitting layer, the retaining wall, and a portion of the device layer. The second inorganic layer may cover the entire organic layer and at least a portion of the first inorganic layer. Herein, the second inorganic layer on the surface of the display region may be very flat, but the unevenness may be formed in the retaining wall and the encapsulation layer at the periphery portion of the non-display region.

In block 403, the method may include filling a surface of the non-display region with a sealant layer to smooth a surface of the non-display region.

In an embodiment, the surface of the non-display region may be filled with a sealant layer to smooth the surface of the non-display region. In an embodiment, a lateral side sealant may be applied on a periphery of the display panel by using a dispenser (coating device) to form the sealant layer, and the coated sealant layer in the region corresponding to the unevenness may be mutually compensated with a shape of the unevenness of the periphery portion of the non-display region, so as to form a smooth contact surface on the sealant layer and the surface of the encapsulation layer, thereby the surface of the non-display region may be smoothed.

Then, after block 403, the PECVD device may be continuously adopted to form an inorganic flat layer on the surface of the display region and at least a portion of the surface of the sealant layer. The inorganic flat layer may be an inorganic flat layer, which may achieve a relatively flat film layer, so that a wiring may be arbitrarily performed on the periphery of the display panel. For example, a touch electrode layer may be formed on the inorganic flat layer.

Different from the prior art, the OLED display panel of the present disclosure may include a display region and a non-display region. The surface of the non-display region may be filled with a sealant layer to smooth the surface of the non-display region, a peripheral wiring may be facilitated, and a process difficulty of wiring may be reduced. Moreover, the sealant layer may absorb and disperse the stress between the layers, and may improve a de-lamination condition caused by an excessive stress.

The above description merely illustrates some exemplary embodiments of the disclosure, which however are not intended to limit the protection scope of the invention. Any equivalent structural or flow modifications or transformations made according to the specification and drawings of the disclosure, or any direct or indirect applications of the disclosure on any other related fields, shall all fall in the scope of the disclosure.

What is claimed is:

1. An organic light-emitting diode display panel comprising:
    a display region, a non-display region, and an organic light-emitting layer;
    wherein the display region corresponds to a position where the organic light-emitting layer is located in;
    wherein a sealant layer is arranged on the non-display region, and the sealant layer is not arranged on the display region where the organic light-emitting layer is located in;
    wherein an inorganic flat layer is formed on a surface of the display region and on at least a portion of a surface of the sealant layer; and
    a touch electrode layer on the inorganic flat layer in the display region and at least a portion of non-display region.

2. The organic light-emitting diode display panel according to claim 1, wherein
    the non-display region comprises:
    a device layer and at least one retaining wall disposed on the device layer, and the sealant layer is disposed on the retaining wall.

3. The organic light-emitting diode display panel according to claim 2, wherein
the sealant layer covers the retaining wall and the device layer not covered by the retaining wall;
a recessed region in the non-display region relative to the display region is filled by the sealant layer, further to smooth a contact surface between the non-display region and the display region.

4. The organic light-emitting diode display panel according to claim 2, wherein
the sealant layer is formed by a coating process;
the sealant layer is made of an organic material; and the organic material comprises any one of ultraviolet glue and frame glue.

5. The organic light-emitting diode display panel according to claim 1, wherein
the non-display region comprises:
a device layer and at least one retaining wall disposed on the device layer;
the sealant layer covering the retaining wall and the device layer not covered by the retaining wall;
a recessed region in the non-display region relative to the display region being filled by the sealant layer, further to smooth a contact surface between the non-display region and the display region.

6. The organic light-emitting diode display panel according to claim 5, wherein
the non-display region further comprises:
an encapsulation layer, the encapsulation layer extending from the display region to the non-display region; the encapsulation layer covering the retaining wall and a portion of the device layer; and
the sealant layer covers at least a portion of the encapsulation layer and the device layer not covered by the encapsulation layer; and the sealant layer is smoothly and transitionally connected with the encapsulation layer located in the display region, so as to for a smooth connection surface between the sealant layer and the surface of the encapsulation layer that is not covered.

7. The organic light-emitting diode display panel according to claim 6, wherein
the encapsulation layer comprises:
a first inorganic layer, a second inorganic layer, and an organic layer disposed between the first inorganic layer and the second inorganic layer;
the first inorganic layer is formed on the device layer, and the first inorganic layer covers the retaining wall.

8. The organic light-emitting diode display panel according to claim 1, wherein
the sealant layer is made of an organic material; and
the organic material comprises any one of ultraviolet glue and frame glue.

9. The organic light-emitting diode display panel according to claim 1, wherein
the sealant layer is formed by a coating process.

10. An organic light-emitting diode display apparatus, wherein
the organic light-emitting diode display apparatus comprises:
an organic light-emitting diode display panel; the organic light-emitting diode display panel comprising:
a display region, a non-display region, and an organic light-emitting layer;
wherein the display region corresponds to a position where the organic light-emitting layer is located in;
wherein a sealant layer is arranged on the non-display region, and the sealant layer is not arranged on the display region where the organic light-emitting layer is located in;
wherein an inorganic flat layer is formed on a surface of the display region and at least a portion of the surface of the sealant layer; and
a touch electrode layer is arranged on the inorganic flat layer in the display region and at least a portion of non-display region.

11. The organic light-emitting diode display apparatus according to claim 10, wherein
the non-display region comprises:
a device layer and at least one retaining wall disposed on the device layer, and the sealant layer is disposed on the retaining wall.

12. The organic light-emitting diode display apparatus according to claim 11, wherein
the sealant layer covers the retaining wall and the device layer not covered by the retaining wall;
a recessed region of the non-display region relative to the display region is filled by the sealant layer, further to smooth a contact surface between the non-display region and the display region.

13. The organic light-emitting diode display apparatus according to claim 10, wherein
the non-display region comprises:
a device layer and at least one retaining wall disposed on the device layer;
the sealant layer covering the retaining wall and the device layer not covered by the retaining wall;
a recessed region in the non-display region relative to the display region being filled by the sealant layer, further to smooth a contact surface between the non-display region and the display region.

14. The organic light-emitting diode display apparatus according to claim 13, wherein
the non-display region further comprises:
an encapsulation layer, the encapsulation layer extending from the display region to the non-display region; the encapsulation layer covering the retaining wall and a portion of the device layer; and
the sealant layer covers at least a portion of the encapsulation layer and the device layer not covered by the encapsulation layer; and the sealant layer is smoothly and transitionally connected with the encapsulation layer located in the display region, so as to for a smooth connection surface between the sealant layer and the surface of the encapsulation layer that is not covered.

15. The organic light-emitting diode display apparatus according to claim 14, wherein
the encapsulation layer comprises:
a first inorganic layer, a second inorganic layer, and an organic layer disposed between the first inorganic layer and the second inorganic layer;
the first inorganic layer is formed on the device layer, and the first inorganic layer covers the retaining wall.

16. The organic light-emitting diode display apparatus according to claim 10, wherein
the sealant layer is formed by a coating process, and the sealant layer is made of an organic material; and
the organic material comprises any one of ultraviolet glue and frame glue.

17. A manufacturing method of an organic light-emitting diode display panel, wherein the method of fabricating comprises:
preparing the substrate;

forming an organic light-emitting layer, a display region, and a non-display region of the display panel on the substrate;
arranged a sealant layer on the non-display region, not arranged on the display region where the organic light-emitting layer is located in;
wherein the display region corresponds to a position where the organic light-emitting layer is located in;
wherein an inorganic flat layer is formed on a surface of the display region and at least a portion of the surface of the sealant layer; and
a touch electrode layer is arranged on the inorganic flat layer in the display region and at least a portion of non-display region.

18. The organic light-emitting diode display panel according to claim 1, wherein
the sealant layer has a smoothly curved surface without any corners.

19. The organic light-emitting diode display panel according to claim 1, wherein
the touch electrode layer extend to the non-display region.

* * * * *